United States Patent
Bansemir et al.

[11] Patent Number: 5,994,640
[45] Date of Patent: Nov. 30, 1999

[54] SOLAR GENERATOR WITH ENERGY DAMPING FOR SATELLITES

[75] Inventors: Horst Bansemir, Munich; Albert Gietl, Brannenburg; Markus Bauer, Munich; Ottmar Haider, Unterhaching, all of Germany

[73] Assignee: Eurocopter Deutschland GmbH, Munich, Germany

[21] Appl. No.: 09/061,466

[22] Filed: Apr. 16, 1998

[30] Foreign Application Priority Data

Apr. 16, 1997 [DE] Germany ............................ 197 15 788

[51] Int. Cl.$^6$ ................................................... H01L 25/00
[52] U.S. Cl. ........................ 136/244; 136/292; 428/116; 52/793.1; 52/793.11; 52/173.3
[58] Field of Search .................................. 136/244, 292; 428/116; 52/793.1, 793.11, 173.3

[56] References Cited

U.S. PATENT DOCUMENTS

| | | | |
|---|---|---|---|
| 3,834,096 | 9/1974 | Becker | 52/173 |
| 4,394,529 | 7/1983 | Gounder | 136/245 |

FOREIGN PATENT DOCUMENTS 2840807  3/1980  Germany .

OTHER PUBLICATIONS

T. W. Nye et al.; "Applications of Robust Damping Treatments to Advanced Spacecraft Structures"; Guidance and Control 1996, vol. 92; AAS 96–066, pp. 531–543.

Primary Examiner—Mark Chapman
Attorney, Agent, or Firm—W.F. Fasse; W.G. Fasse

[57] ABSTRACT

A solar generator for use in satellites or spacecraft includes a plurality of solar cells mounted on a support structure panel. The support structure panel includes a honeycomb cell structure core (4) sandwiched between a bottom cover skin (5) and a top cover skin (2). Vibration damping elements (11) are incorporated and bonded into the honeycomb core, and vibration damping film strips (10) are adhesively bonded onto an outer surface of at least one of the outer cover skins. The damping elements (11) respectively include a damping ring (13) made of an elastomeric material, between inner and outer structural rings (14, 12), whereby the outer ring is bonded to the honeycomb core and the inner ring provides a mounting location. The damping film strips are positioned at locations of maximum vibrational excitation in the panel due to noise pressure loading. The damping elements damp vibrations in the range from 30 Hz to 100 Hz, and the damping film strips damp noise pressure loads in the frequency range from 150 Hz to 500 Hz.

30 Claims, 6 Drawing Sheets

FIG. 1A PRIOR ART
FIG. 1B PRIOR ART
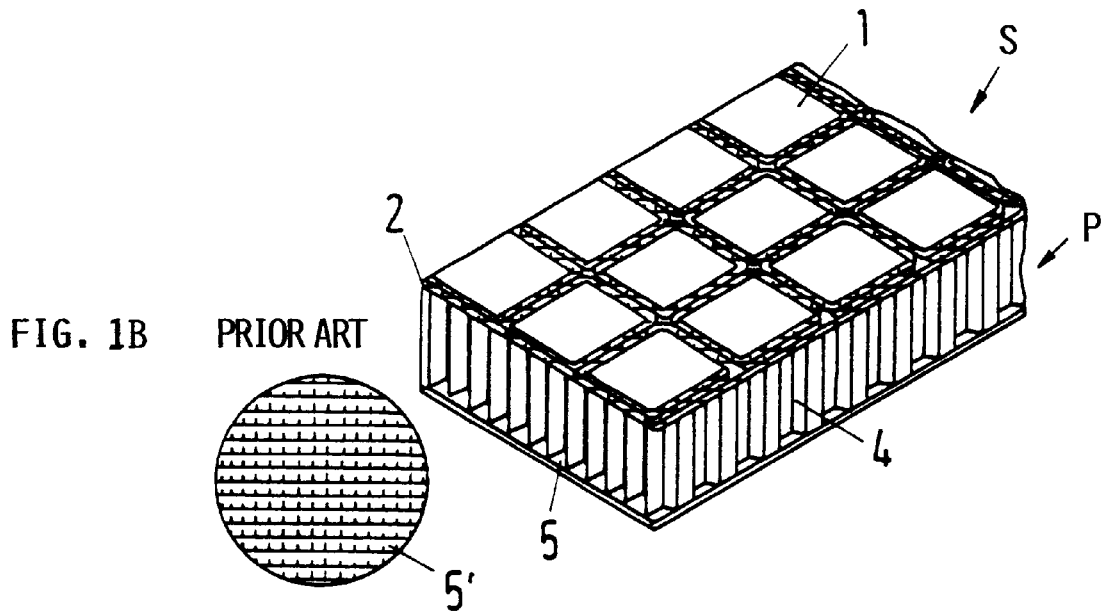
FIG. 2 PRIOR ART
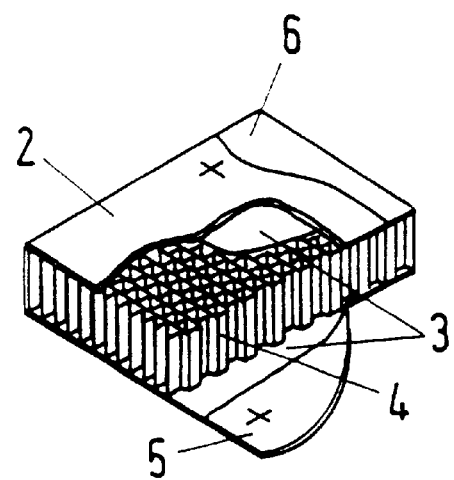

SOLAR GENERATOR WITH ENERGY DAMPING FOR SATELLITES

PRIORITY CLAIM

This application is based on and claims the priority under 35 U.S.C. §119 of German Patent Application DE 197 15 788.2, filed on Apr. 16, 1997.

FIELD OF THE INVENTION

The invention relates to a solar generator comprising a plurality of solar cells mounted on a support panel structure, for use in satellites and especially telecommunication satellites. The invention also particularly relates to a vibration energy damping structural panel.

BACKGROUND INFORMATION

The advantages, conveniences and comforts that have been achieved by the use of satellites have become expected or even required nowadays. The use of satellites and especially telecommunications satellites is essentially required for carrying out many different functions and operations. For example, data and information are acquired, transmitted, and relayed by satellites in the fields of weather forecasting based on earth studies and weather pattern recognition, environmental studies and monitoring, reconnaissance, telephone communications, and television transmissions, among others. Additionally, it has now become possible to achieve a worldwide telephone network using mobile telephones linked through satellite communication. All of these manmade celestial bodies require a continuous supply of electrical power, and in some cases at a rather substantial power level, in order to carry out their required functions of acquiring, transmitting, and relaying data and other information. The necessary power supply must operate reliably without problems and without interruptions over a long operating lifespan. In order to provide the necessary electrical energy, it has been typical to use solar generators comprising solar cells mounted on suitable carrier structures such as panel structures. In this context, the carrier structure is suitable if it is able to reliably withstand the arising loads, is compatible with the material of the solar cells, and still remains lightweight and cost economical. The arising loads include the mechanical loads during launch and during deployment, for example, while the compatibility between the support structure and the solar cell material includes compatibility of the respective thermal expansion coefficients of the materials and electrical insulation or isolation of the solar cells, for example.

More specifically, solar generators suitable for powering satellites must be able to reliably provide a substantially constant power output during a prescribed operating lifetime on the order of 10 to 12 years. Solar cells made of silicon or gallium arsenide on a lightweight support structure are particularly suitable in this context. The support structure in turn must comprise certain characteristics so as not to negatively influence other components of the satellite, such as antennas, tanks, orbital path tracking systems and the like.

The major mechanical loads on the solar generator arise during the launch process, and especially involve vibrations with an acceleration of 30 Gs, i.e. 30 times the earth's gravity. In order to withstand these mechanical loads, the solar generator, and particularly the support structure, must be so designed and constructed to withstand the forces arising from such vibrations and such extreme acceleration conditions. An additional mechanical load results from the noise pressure that arises under the aerodynamic fairing or nose cone at the nose of the rocket or launch vehicle due to the extremely loud noise generated by the rocket engines upon ignition and during the launch phase. The portions of lightweight support structures that are most seriously endangered by this noise pressure loading are sandwich composite components having extremely thin cover skins.

A few minutes after a successful launch of a satellite, the various functions of the satellite are tested and monitored while the satellite is located in a low earth orbit. Then, the solar generator panels are unfolded and deployed, before the telecommunications satellite is moved through a transitional orbital path to its final geostationary orbital path by means of reignition of the rocket engine or positional thrusters. The solar generator typically includes two solar panels or wings having a length of up to 12 m. These long solar panel wings present an inertial mass such that the corresponding support structure is subject to a bending load upon the ignition and again upon the shut-down of the satellite engine or thrusters. Once the satellite is in a stable orbit, then the solar panel support structures are only subject to loads caused by temperature variations and associated thermal expansion of the components.

Since it is an especially important goal to achieve a low weight of the solar generator in flying bodies such as earth-launched satellites, it is desirable to use fiber-reinforced composite materials for fabricating the support structures, because such composite materials provide a considerably higher specific strength and stiffness in comparison to all metal materials. In order to achieve the stiffest and lightest support structure possible, it is especially suitable to use laminates of high modulus fibers in the form of a sandwich construction. The basic arrangement of a sandwich construction, which may be used as a support structure for the solar cells of a solar generator for a telecommunications satellite, is shown in FIG. 1. FIGS. 2 and 3 show conventional improved support structures that are able to withstand greater mechanical loads than the simpler structure shown in FIG. 1.

It has been determined that the main mechanical loads effective on the support structure comprise vibrations in the frequency range from 30 Hz to 100 Hz, while secondary loads resulting from the noise pressure arise in a frequency range from 150 Hz to 500 Hz. The loads resulting from the noise pressure during launch of the rocket increase sharply with the dimensions of the solar generator, and especially the panel area dimensions thereof. Thus, the maximum size of the solar generator is limited by its ability to withstand the noise pressure loads resulting during launch. Moreover, the deformations of the support structure resulting from the vibrations and noise pressure cause damage to the sensitive solar cells mounted on the support structure.

SUMMARY OF THE INVENTION

In view of the above, it is an object of the invention to provide a solar generator that reliably withstands considerably higher loads, as arise during the launch of a rocket for transporting a telecommunications satellite equipped with the solar generator into the satellite's earth orbit, and that particularly with-stands vibrations in the frequency range from 30 Hz to 100 Hz and a noise pressure in the frequency range from 150 Hz to 500 Hz, in comparison to conventional solar generators. The invention further aims to provide a composite panel support structure for use in a solar generator or other applications for achieving the above objects. The invention further aims to overcome or avoid the other disadvantages of the prior art, and to achieve additional advantages, as apparent from the present description.

The above objects have been achieved in a solar generator according to the invention, comprising a plurality of solar cells mounted on a support structure, wherein the support structure comprises a honeycomb cell structure core sandwiched between a bottom cover skin having local strengthening layers and a top cover skin having local strengthening layers, whereby the length-wise axes of the honeycomb cells extend perpendicularly to the cover skins. Further according to the invention, damping elements are installed in holes provided in the honeycomb cell structure core. Particularly, the damping elements are adhesively bonded and thus incorporated into the structure of the core, and the damping elements may include mounting lugs for mounting the solar generator on the satellite, or for mounting equipment on the solar generator. Further preferably according to the invention, damping film strips are adhesively bonded onto the outer surface of the lower cover skin at locations spaced apart from one another. As a further preferable feature, an electrically insulating layer is arranged on the outer surface of the upper or top cover skin, such that this electrically insulating layer is interposed between the top cover skin and the solar cells.

The damping film strips may be applied as a single layer or in a multi-layered fashion on the outer surface of the bottom cover skin facing away from the honeycomb cell structure core. The damping film strips may be in the form of continuous or interrupted stripe-shaped strips that are adhesively bonded onto the cover skin. The damping film strips are matched or adapted to the specific stiffness of the sandwich cover skin, and the directional orientation and particular locations of the strips are adapted to the particular excitation characteristic of the solar generator in view of the acoustically excited vibrations. In other words, the solar generator panel can be tested to determine the particular locations subject to the greatest vibrational excitation due to the acoustic energy, and the damping film strips are arranged at these locations. By using these damping film strips, the invention achieves an increased damping characteristic and thereby a reduced excitation characteristic in the frequency range from 150 Hz to 500 Hz.

On the other hand, by providing the damping elements arranged or incorporated into the honeycomb cell structure core, the invention achieves a considerable increase in the resistance to deflection, deformation and failure under loads resulting from mechanic al vibrations in a frequency range from 30 Hz to 100 Hz. To achieve this, the damping elements are particularly in the form of cylindrical, concentric fiber composite rings having one or more elastomer layers or rings arranged therebetween. These concentric ring damping structures are then glued into the honeycomb cell structure core between the two cover skins.

BRIEF DESCRIPTION OF THE DRAWINGS

In order that the invention may be clearly understood, it will now be described in connection with example embodiments, with reference to the drawings, wherein:

FIG. 1A is a perspective view showing the basic construction of a conventional solar generator panel;

FIG. 1B is an enlarged partial plan view of a bottom cover skin of the sandwich panel shown in FIG. 1A;

FIG. 2 is a partially broken open perspective view of a conventional sandwich panel support structure;

Figure 3:
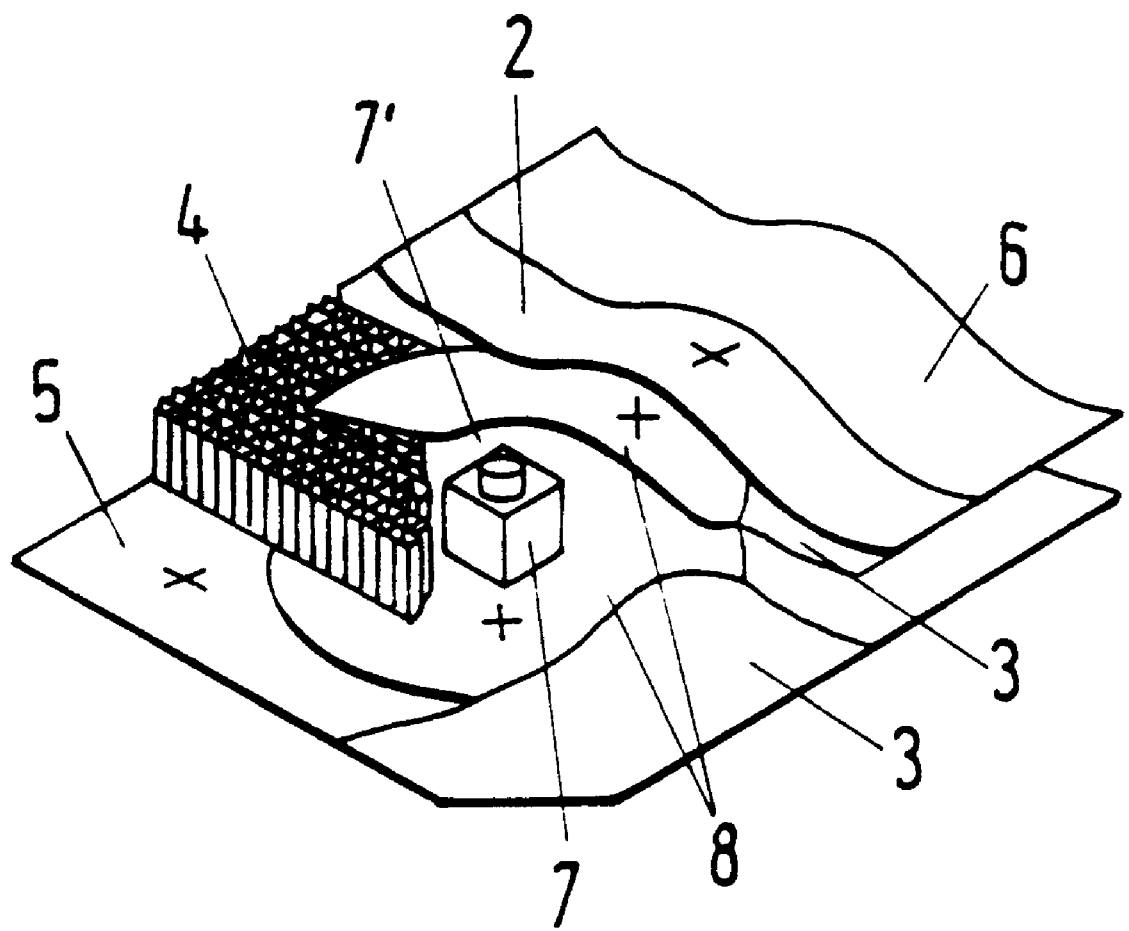
FIG. 3 is a partially broken open perspective view of another conventional sandwich panel support structure for a solar generator having load introduction elements incorporated therein.

DETAILED DESCRIPTION OF PREFERRED EXAMPLE EMBODIMENTS AND OF THE BEST MODE OF THE INVENTION

FIG. 1 shows the basic construction of a generally conventional solar generator S comprising a plurality of rectangular solar cells 1 arranged next to one another on a sandwich panel support structure P, which comprises a honeycomb cell structure core 4 sandwiched between a top cover skin 2 and a bottom cover skin 5. FIG. 1B shows an enlarged plan view of a circular portion of the outer or bottom surface of the bottom cover skin 5. The view of FIG. 1B shows, for example, a woven fiber composite surface skin texture.

FIG. 2 shows the support structure for the solar generator, which is suitable for use in powering a satellite, in a partially broken open view. As can be seen, a respective adhesive layer 3 is used respectively between the honeycomb cell structure core 4 and the bottom cover skin 5 on the one hand, and between the honeycomb cell structure core 4 and the top cover skin 2 on the other hand, for respectively adhesively bonding together the individual components. An electrically insulating layer 6 is arranged on the outer surface of the top cover skin 2, and the solar cells 1 as shown in FIG. 1 are then arranged on the electrically insulating layer 6.

In order to increase the strength and resistance against deformation caused by mechanical loading of such a conventional support structure, it is conventionally known to use support structures having the construction shown in FIG. 3 for use in telecommunications satellites. In this structure, holes or openings are machined into the honeycomb cell structure core 4, and then carbon fiber blocks 7 are glued into the holes provided in the core 4 by means of a splicing adhesive or glue. These carbon fiber blocks 7 then serve as load introduction elements. In order to further stiffen the structure, additional laminate pieces 8 are respectively arranged between the two cover skins 2 and 5 and the carbon fiber blocks 7, whereby these supplemental laminate pieces 8 act as doubling or reinforcing elements. The carbon fiber blocks 7 are generally rectangular, but may each have a protruding bushing 7' on the top side or end thereof. Also in this case, the individual components are adhesively bonded together by means of adhesive layers 3 arranged between the core 4 on the one hand and the cover skins 2 and 5 and the reinforcing layers 8 on the other hand.

The support structure panel according to the invention begins with the above described conventional support structure as a starting point, and makes improvements as follows. First, in order to achieve the stiffest and lightest possible support structure, the invention calls for the use of laminates of high modulus fibers in the form of a sandwich panel construction. The respective cover skins especially comprise composite layers of carbon reinforcement fibers in epoxy resin. The honeycomb cell structure core may be made of aluminum, or alternatively may be made of a polyamide paper, aramid fibers, aramid paper, a glass fiber composite, or a carbon fiber composite. The individual honeycomb cells may have a regular or irregular hexagonal, square, rectangular or other polygonal sectional shape, or a round sectional shape.

Figure 6:
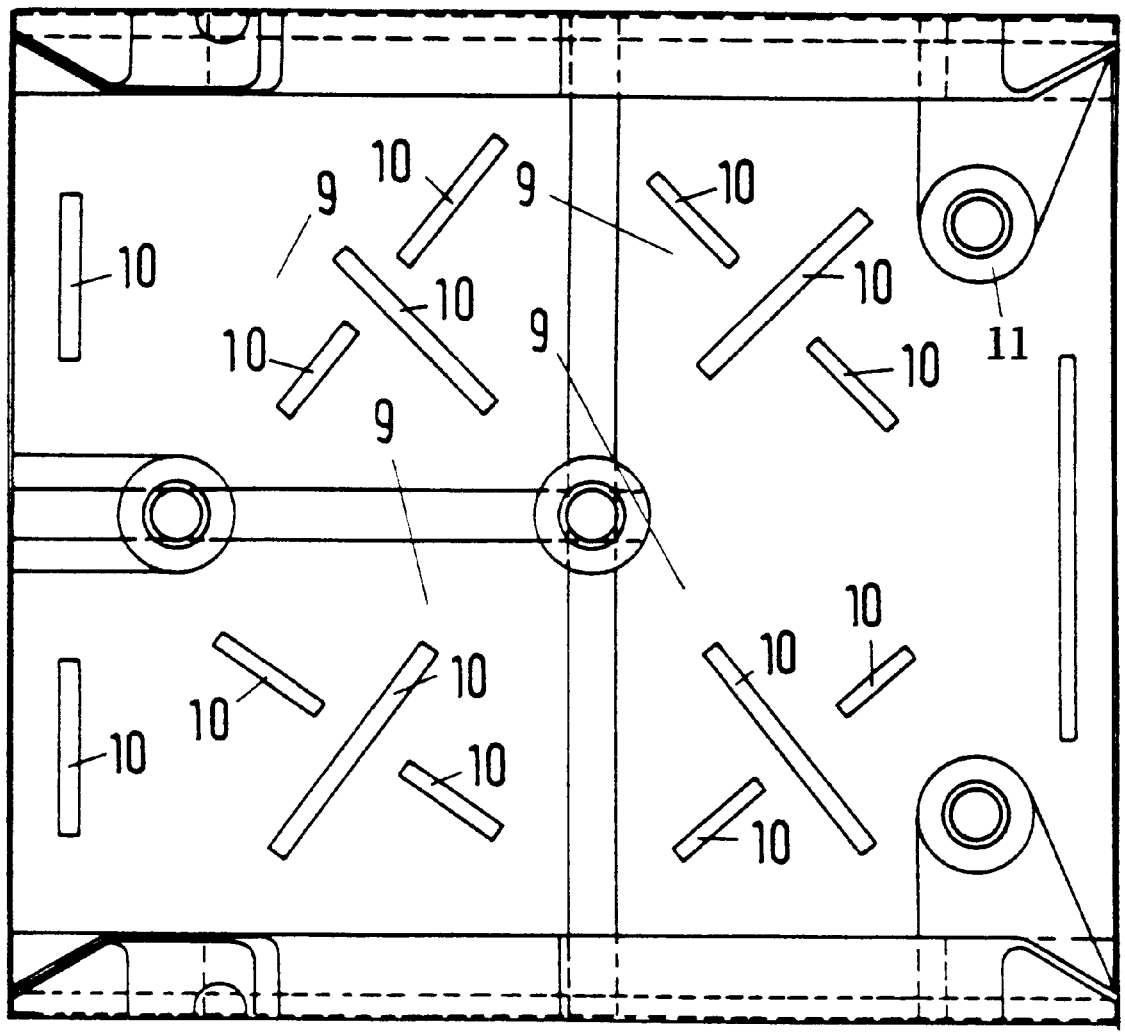
FIG. 6 is a plan view of the bottom surface of a panel support structure according to the invention, incorporating damping elements and damping film strips.

Furthermore, the invention provides special damping elements and damping film strips as will be described next. FIG. 6 schematically shows, from the bottom side thereof, a first example embodiment of a composite panel support structure according to the invention, which includes a honeycomb cell structure core 4 sandwiched between a top cover skin 2 and a bottom cover skin 5. As shown in FIG. 6, a plurality of elongate stripe-shaped damping film strips 10 are applied on the outer surface of the bottom cover skin 5, i.e. on the surface thereof facing away from the honeycomb core 4. The damping film strips 10 respectively have differing lengths and widths, and are adhesively bonded on the outer surface of the cover skin 5 in a particular pattern including certain strips 10 extending perpendicularly to each other.

The damping film strips 10 may comprise strips cut from a tape or web of a fiber-reinforced prepreg material, such as a carbon fiber prepreg, adhesively bonded onto the cover skin 5. The damping film strips 10 may comprise any material used for the cover skins, or alternatively may be metal foil strips or woven or non-woven fiber textile or paper strips impregnated with a resin.

The dimensions, directional orientations and locations of the individual damping film strips 10 are selected dependent on and responsive to the particular excitation characteristic of the support structure panel in response to the loads arising from the noise pressure during launch. The most effective arrangement of the individual damping film strips 10 can be empirically determined by carrying out noise excitations tests on the respective panel. The damping film strips 10 may be applied in a single layer or in a multi-layered fashion, and may be continuous strips extending across the panel or intermittent i.e. interrupted strips as shown in FIG. 6. Furthermore, the material and dimensions of the strips are adapted to the particular stiffness characteristic of the sandwich cover skin. Particularly, the material, dimensions and arrangement of these damping film strips 10 adhesively bonded onto the bottom cover skin 5 is selected so as to reduce the loads resulting from the noise pressure in the frequency range from 100 Hz to 500 Hz.

Figure 4:
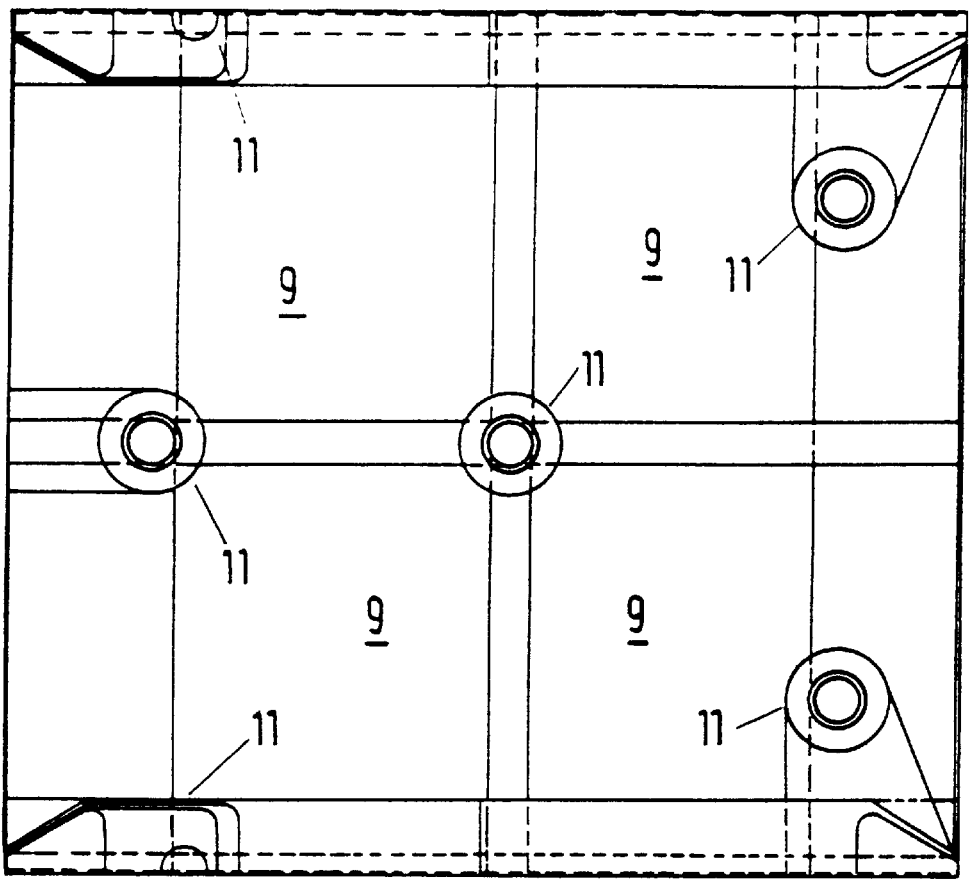
FIG. 4 is a plan view of a portion of a sandwich panel support structure according to the invention, incorporating damping elements.
Figure 7:
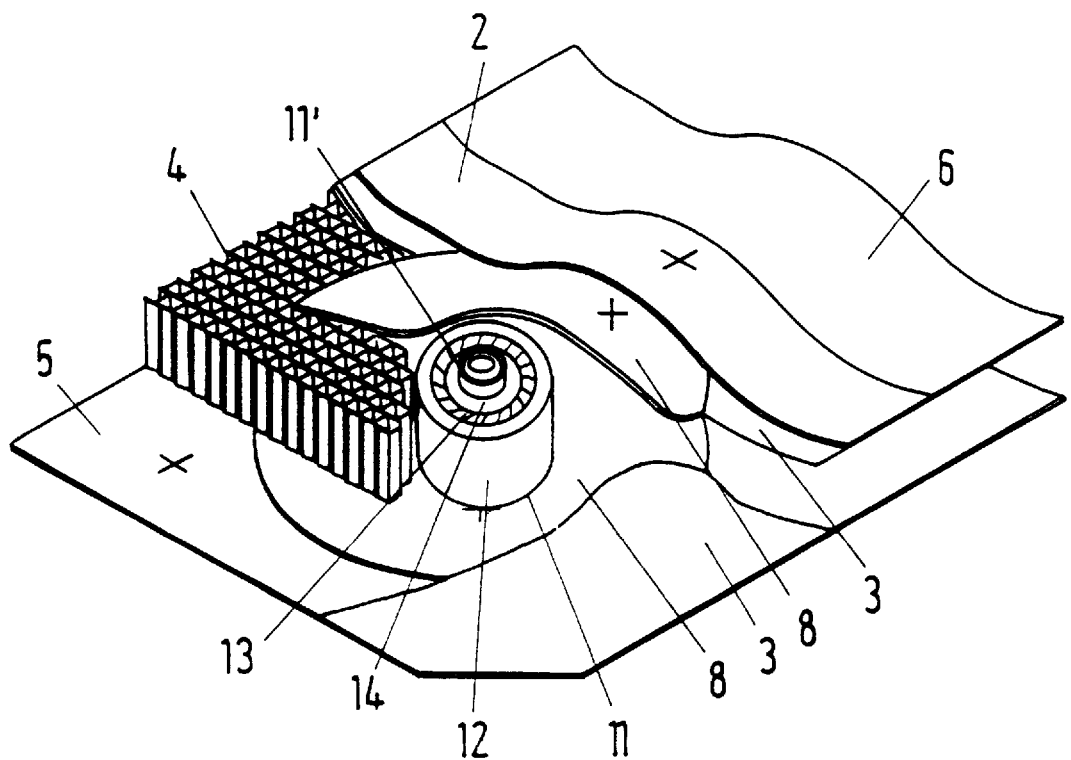
FIG. 7 is a partially broken open perspective view of a portion of a panel support structure according to the invention, incorporating a vibration damping load introduction element.

FIG. 6 also shows the arrangement of special damping elements 11 incorporated into the support structure panel according to a second embodiment of the invention, which will now be further described in connection with FIGS. 4, 5, 7, 8A, 8B and 8C. As can be seen in FIGS. 4, 6, and especially FIG. 7, the inventive arrangement uses cylindrical damping elements 11 instead of the conventional rectangular carbon fiber blocks 7 as mounting elements or hold-down force introduction elements. The cylindrical damping elements 11 according to the invention have a particular construction as will be described below, and are respectively adhesively bonded into place in the honeycomb cell structure core 4 and with the adhesive layers 3, between the top and bottom cover skins 2 and 5. Additional reinforcement layers 2 may be arranged between the damping elements 11 and the cover skins 2 and 5, in a locally limited area around the damping elements 11, as shown in FIG. 7. In order to install the cylindrical damping elements 11, it is a simple matter to bore a cylindrical hole into the honeycomb core 4, preferably during or even after fabrication of the sandwich panel, and then to glue the respective damping elements 11 into position.

As shown especially in FIGS. 7, 8A, 8B and 8C, each damping element 11 comprises an outer ring 12 made of a fiber-reinforced composite material, an inner ring 14 made of a fiber-reinforced composite material arranged concentrically within the outer ring 12, and an elastomer ring 13 arranged concentrically within the outer ring 12, i.e. between the outer ring 12 and the inner ring 14. Preferably, the two fiber-reinforced composite rings 12 and 14 are respectively bonded onto the elastomeric ring 13 by vulcanization. In this way, the inner and outer rings are connected to each other through the vibration damping elastomeric material of the ring 13. Any known elastomeric material having the required strength and degree of stiffness or elasticity may be used for the ring 13. One or both of the inner and outer rings may be made of a metal material rather than a fiber reinforced composite.

Figure 8A:
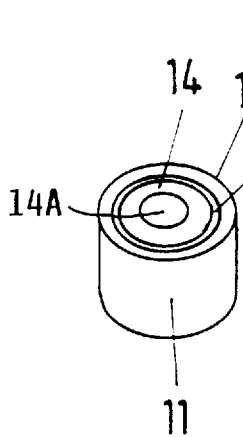
FIGS. 8A, 8B, and 8C respectively show examples of different constructions of damping elements according to the invention.
Figure 8B:
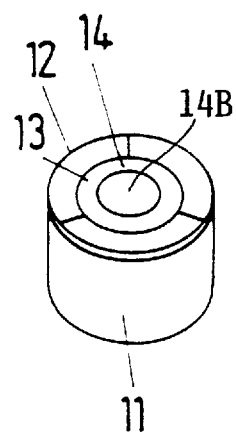
Figure 8C:
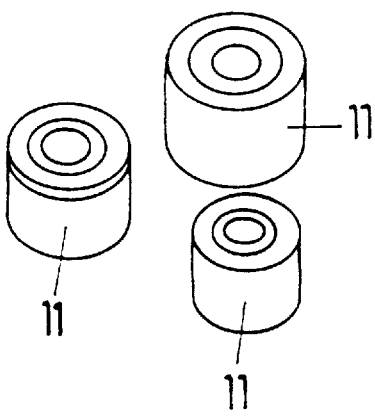

It is also possible to use different configurations of the rings, or to provide a greater plurality of alternating elastomeric rings and fiber reinforced composite rings, as represented by some examples in FIGS. 8A, 8B and 8C. FIG. 8A shows the above mentioned configuration with an elastomeric ring 13 concentrically between outer and inner composite rings 12 and 14, whereby the inner composite ring 14 may have a hollow core 14A or may have a solid core piece inserted therein. FIG. 8B represents a configuration in which the inner ring 14 comprises a solid inner core piece 14B, while the outer ring 12 is divided into three segments making up the complete ring. It is alternatively possible to divide the elastomeric ring 13 into two or more segments making up the complete cylindrical ring. FIG. 8C represents three damping elements 11 having different dimensions, whereby it is possible to select the damping element 11 having the appropriate dimensions for providing the damping characteristic required at each particular damping location.

As further shown in FIG. 7, a mounting lug or mounting stud 11' can be provided to extend from the upper end of the damping element 11, whereby this mounting stud 11' may include an internal threaded hole or the like by which the panel structure may be mounted or by which auxiliary devices may be mounted on the panel structure. Alternatively, the damping element merely acts as a force transmitting member to be held in a hold-down clamp or the like. In any event, the combined mounting elements and damping elements 11 serve to damp vibrations that would otherwise be transmitted through the mounting, and to damp vibrations that are excited in the panel, i.e. to damp out or minimize vibrations passing from the inner ring connected with a mounting member to the outer ring bonded with the honeycomb core or vice versa. The damping characteristics of the damping elements 11 are particularly tuned and designed to withstand and damp out vibrations in the frequency range from 30 Hz to 100 Hz.

The damping elements 11 will also provide vibration damping even when they are not provided with mounting studs 11' and used as mounting elements. The materials, dimensions and construction of the damping element 11 can be so selected that the elastomeric ring 13 provides vibration damping between the outer ring 12 which is bonded to and vibrates together with the honeycomb core 4, and the inner ring 14 which vibrates at least partially independently from the outer ring 12, being linked thereto only by the elastomeric ring 13. For this purpose, to provide an independently vibrating inertial mass, the inner ring 14 may alternatively be made of metal.

In the particularly preferred embodiment of the invention, the composite panel support structure for a solar generator for a telecommunications satellite includes both the damping elements 11 incorporated into the honeycomb cell structure core 4 at locations spaced apart from one another, as well as the damping film strips 10 adhesively bonded onto the outer surface of the bottom cover skin 5. In this manner, the resultant composite panel support structure achieves an optimal damping of loads resulting from both the vibrations and the noise pressure that arise during launch and deployment of the satellite.

Figure 5:
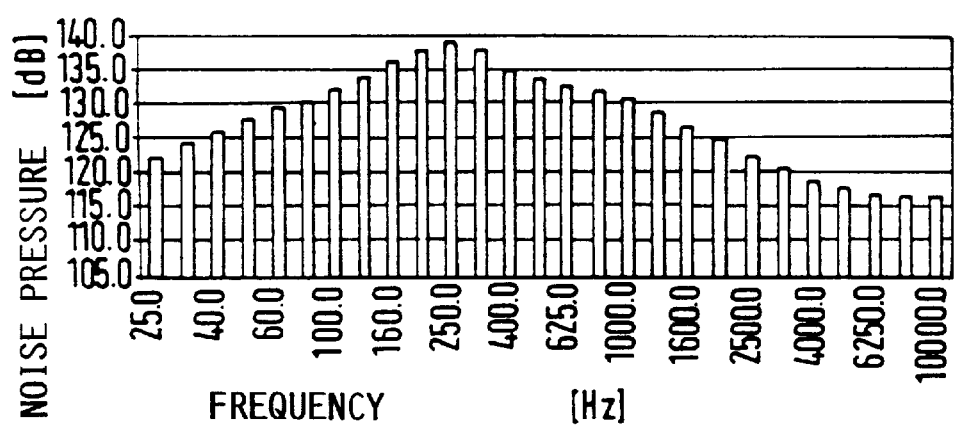
FIG. 5 is a bar graph representing a typical noise pressure distribution over a range of frequencies during launch of a rocket.
Figure 9:
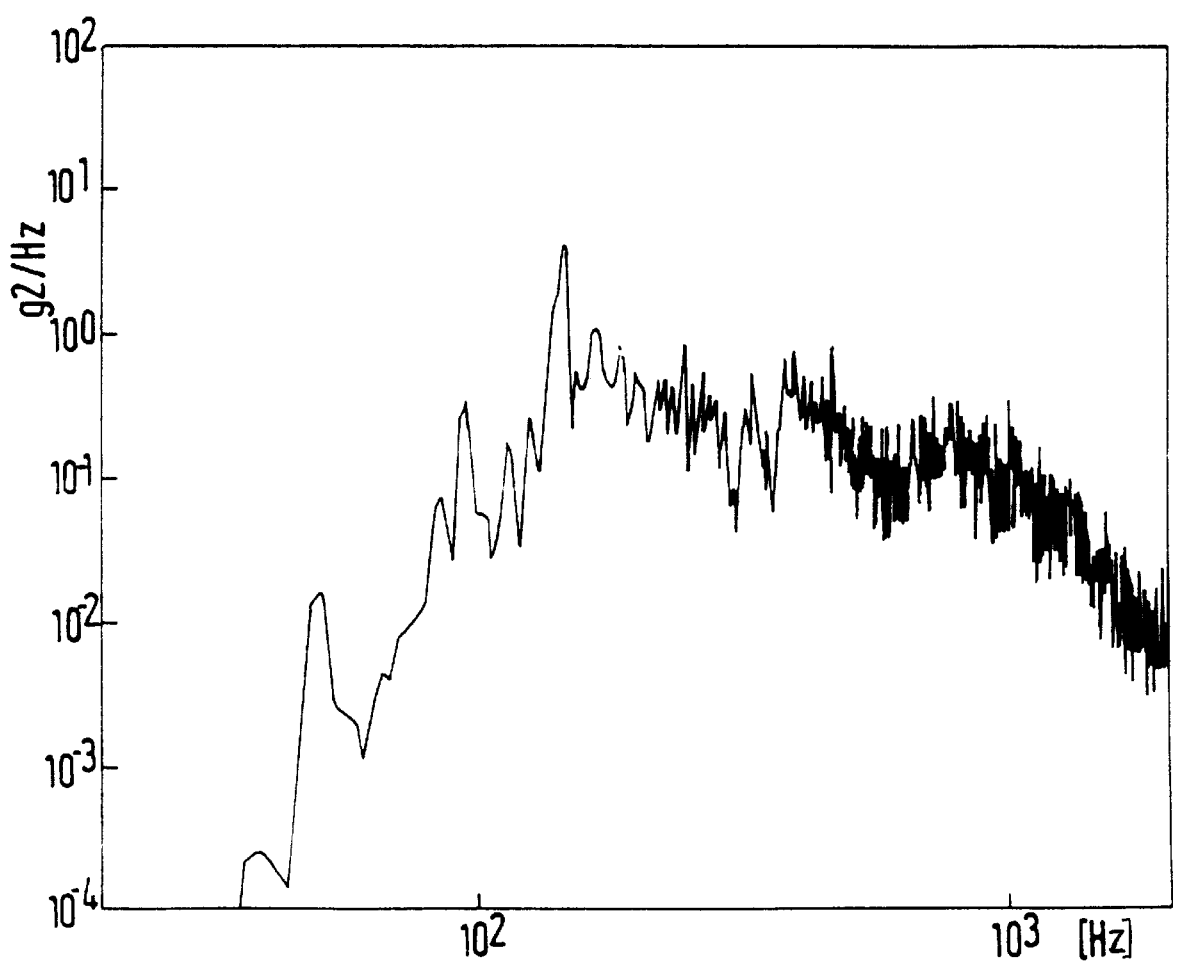
FIG. 9 is a graphical representation of the vibrational behavior of a panel support structure as a result of the loads arising due to the noise pressure during launch of the rocket.

FIG. 5 shows a representative example of the noise level in decibels (dB) over a range of frequency, resulting during launch of a rocket carrying a satellite, for example. In FIG. 5, it is clear that the maximum noise pressure arises in the frequency range from 100 Hz to 500 Hz. For this reason, the damping film strips 10 are particularly used and embodied according to the invention to provide damping in this frequency range from 100 Hz to 500 Hz. FIG. 9 shows the vibrational response of the composite panel support structure as a result of the noise pressure loading, whereby the ordinate axis represents the acceleration $G^2$/Hz and the abscissa axis represents the frequency.

While the above example embodiments have been discussed in the context of solar generators for satellites, the present damped composite panel support structures can be used in a wide range of applications. For example, the present damped composite panel support structures can be used as a mounting base for any type of vibration sensitive instruments or equipment.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A solar generator comprising a support structure and a plurality of solar cells mounted on said support structure, wherein said support structure comprises a first cover skin, a second cover skin, a honeycomb cell structure core arranged between said first and second cover skins such that honeycomb cells of said core are oriented with lengthwise axes of said cells extending perpendicular to at least one of said cover skins, and a plurality vibration of damping elements respectively arranged in respective holes in said core.

2. The solar generator of claim 1, wherein each one of said damping elements has a circular cylindrical shape, and said respective holes in said core are circular cylindrical bored holes.

3. The solar generator of claim 2, wherein each one of said damping elements respectively comprises a cylindrical annular outer ring made of a metal or a fiber-reinforced composite material, an elastomer ring made of an elastomer material arranged within and fixed to said outer ring, and an inner member made of a metal or a fiber-reinforced composite material arranged within and fixed to said elastomer ring.

4. The solar generator of claim 3, wherein said inner member comprises a cylindrical annular inner ring.

5. The solar generator of claim 3, wherein said outer ring and said inner member are respectively made of said fiber-reinforced composite material.

6. The solar generator of claim 3, wherein said outer ring and said inner member are respectively made of said metal.

7. The solar generator of claim 3, wherein said outer ring is made of said fiber-reinforced composite material, and said inner member is made of said metal.

8. The solar generator of claim 3, wherein said outer ring and said inner member are bonded to said elastomer ring by vulcanizing of said elastomer material.

9. The solar generator of claim 3, further comprising at least one intermediate ring made of a metal or a fiber-reinforced composite material and at least one other ring made of an elastomer material arranged alternating with each other between said elastomer ring and said outer ring.

10. The solar generator of claim 2, wherein said damping elements are respectively received and enclosed in said core between said first and second cover skins.

11. The solar generator of claim 10, further comprising locally limited reinforcement layers respectively arranged between said core and said cover skins to cover said holes and said damping elements.

12. The solar generator of claim 1, further comprising a plurality of vibration damping film strips spaced apart from one another and adhesively bonded onto an outer surface of at least one of said first and second cover skins.

13. The solar generator of claim 12, wherein said damping film strips are bonded onto said outer surface of said first cover skin, and further comprising an electrically insulating layer arranged on an opposite outer surface of said second cover skin.

14. The solar generator of claim 12, wherein said damping film strips include different strips respectively having at least one of different widths and different lengths.

15. The solar generator of claim 12, wherein at least a respective one of said damping film strips is a built-up multi-layer strip adhesively bonded onto said outer surface.

16. The solar generator of claim 12, wherein said damping film strips are continuous strips.

17. The solar generator of claim 12, wherein said damping film strips are discontinuous interrupted strips.

18. The solar generator of claim 12, wherein said damping film strips and said first and second cover skins all comprise a resin impregnated fiber material.

19. The solar generator of claim 12, wherein said damping film strips have a stiffness matched to a stiffness of said at least one cover skin.

20. The solar generator of claim 12, wherein said damping film strips include respective strips extending in directions that are perpendicular to each other.

21. The solar generator of claim 12, wherein said damping film strips are arranged at locations on said at least one cover skin that are subject to greatest vibrational excitation.

22. The solar generator of claim 12, wherein each one of said damping elements respectively comprises a cylindrical annular outer ring made of a metal or a fiber-reinforced composite material, an elastomer ring made of an elastomer material arranged within and bonded to said outer ring, and a cylindrical annular inner ring made of a metal or a fiber-reinforced composite material arranged within and bonded to said elastomer ring.

23. The solar generator of claim 22, further comprising at least one intermediate ring made of a metal or a fiber-reinforced composite material and at least one other ring made of an elastomer material arranged alternating with each other between said elastomer ring and said outer ring.

24. The solar generator of claim 22, wherein at least one of said outer ring and said elastomer ring comprises a plurality of independent annular cylinder sectors.

25. The solar generator of claim 12, wherein said damping elements are so constructed and arranged to be adapted to damp vibrations selectively in a frequency range from 30 Hz to 100 Hz, and said damping film strips are so constructed and arranged to be adapted to damp vibrations selectively in a frequency range from 150 Hz to 500 Hz.

26. The solar generator of claim 1, wherein each said damping element has an outer wall that is bonded to said core.

27. The solar generator of claim 1, further comprising locally limited reinforcement layers respectively arranged between said core and said cover skins to cover said holes and said damping elements, wherein respective end faces of said damping elements are bonded to said cover skins by said reinforcement layers.

28. A composite sandwich structural panel with vibration damping, comprising first and second cover skins of resin impregnated fiber composite material, a honeycomb cell structure core sandwiched between said first and second cover skins, vibration damping elements arranged in holes in said core and respectively bonded to said core, and vibration damping film strips adhesively bonded onto an outer surface of at least one of said first and second cover skins.

29. The structural panel of claim 28, wherein said damping elements provide said vibration damping selectively in a frequency range from 30 Hz to 100 Hz, and said damping film strips provide said vibration damping selectively in a frequency range from 150 Hz to 500 Hz.

30. The structural panel of claim 28, wherein each one of said damping elements respectively comprises a cylindrical annular outer ring made of a metal or a fiber-reinforced composite material, an elastomer ring made of an elastomer material arranged within and bonded to said outer ring, and an inner member made of a metal or a fiber-reinforced composite material arranged within and bonded to said elastomer ring.

* * * * *

UNITED STATES PATENT AND TRADEMARK OFFICE
CERTIFICATE OF CORRECTION

PATENT NO. : 5,994,640

DATED : Nov. 30, 1999

INVENTOR(S) : Bansemir et al.

It is certified that error appears in the above-identified patent and that said Letters Patent is hereby corrected as shown below:

Col. 2, line 61, after "particularly" replace "with-stands" by --withstands--;

Col. 3, line 9, before "axes" replace "length-wise" by --lengthwise--;

Col. 3, line 46, after "from" replace "mechanic al" by --mechanical--;

Col. 7, line 51, after "and" replace "a plurality vibration of damping" by --a plurality of vibration damping--;

Signed and Sealed this

Sixteenth Day of May, 2000

*Attest:*

Q. TODD DICKINSON

*Attesting Officer*  *Director of Patents and Trademarks*